United States Patent
Aoyama et al.

(10) Patent No.: US 9,082,434 B2
(45) Date of Patent: Jul. 14, 2015

(54) ASYMMETRIC SENSITIVITY READER

(71) Applicant: HGST Netherlands B.V., Amsterdam (NL)

(72) Inventors: Jun Aoyama, Kanagawa-Ku (JP); Hiroyuki Katada, Odawara (JP); Masato Shiimoto, Odawara (JP); Mikito Sugiyama, Odawara (JP); Yosuke Urakami, Odawara (JP)

(73) Assignee: HGST NETHERLANDS B.V., Amsterdam (NL)

( * ) Notice: Subject to any disclaimer, the term of this patent is extended or adjusted under 35 U.S.C. 154(b) by 0 days.

(21) Appl. No.: 14/067,483

(22) Filed: Oct. 30, 2013

(65) Prior Publication Data

US 2015/0116869 A1    Apr. 30, 2015

(51) Int. Cl.
*G11B 5/39* (2006.01)

(52) U.S. Cl.
CPC .............. *G11B 5/3912* (2013.01); *G11B 5/39* (2013.01)

(58) Field of Classification Search
CPC ......... G11B 5/39; G11B 21/24; G11B 5/3929
USPC ........... 360/319, 235.4, 234.3, 324.12, 324.1, 360/324.2
See application file for complete search history.

(56) References Cited

U.S. PATENT DOCUMENTS

| | | | |
|---|---|---|---|
| 6,333,840 B1 | 12/2001 | Yoda et al. | |
| 6,943,993 B2 | 9/2005 | Chang et al. | |
| 7,982,994 B1 | 7/2011 | Erden et al. | |
| 8,134,802 B2 | 3/2012 | Bai et al. | |
| 8,270,256 B1 | 9/2012 | Juang et al. | |
| 8,570,686 B2* | 10/2013 | Hosomi et al. | 360/125.3 |
| 8,848,317 B2* | 9/2014 | Shiimoto et al. | 360/125.3 |
| 2011/0007426 A1* | 1/2011 | Qiu et al. | 360/313 |
| 2011/0014390 A1* | 1/2011 | Zhou et al. | 427/547 |
| 2011/0261478 A1 | 10/2011 | Takeo et al. | |
| 2011/0292545 A1 | 12/2011 | Katada et al. | |
| 2012/0105994 A1 | 5/2012 | Bellorado et al. | |
| 2012/0236431 A1* | 9/2012 | Hirata et al. | 360/70 |
| 2012/0320473 A1* | 12/2012 | Okamura et al. | 360/294 |
| 2013/0288076 A1* | 10/2013 | Singleton et al. | 428/811.1 |
| 2014/0177105 A1* | 6/2014 | Shiimoto et al. | 360/244 |

OTHER PUBLICATIONS

Lim et al.; "Analysis of Shingle-Write Readback using Magnetic-force Microscopy"; IEEE Transactions on Magnetics; vol. 46, Issue 6; May 2010; 4 pages.
University of California, San Diego; "Digest of the 21st Magnetic Recording Conference TMRC-2010"; Sponsored by the IEEE Magnetics Society; Aug. 2010; 124 pages.
Liu et al. "Effect of Track Asymmetry and Curvature on Shingle Writing Scheme"; Journal Of Applied Physics 109, 07B740 (2011); Oct. 2010; 4 pages.

* cited by examiner

*Primary Examiner* — Allen T Cao
(74) *Attorney, Agent, or Firm* — Patterson & Sheridan, LLP

(57) ABSTRACT

Embodiments described herein generally relate to a magnetic read head wherein read sensitivity distribution is made asymmetric in the off-track direction. The method of making the magnetic head is also disclosed. The read head may comprise a magneto-resistive effect element with an asymmetric structure around the element in the off-track direction and the read sensitivity profile in the off-track direction may also be asymmetric.

20 Claims, 7 Drawing Sheets

ASYMMETRIC SENSITIVITY READER

BACKGROUND OF THE INVENTION

1. Field of the Invention

Embodiments described herein generally relate to a magnetic head and magnetic disk drive for use in a hard disk drive (HDD). More specifically, embodiments described herein relate to a magnetic head and magnetic disk drive used in shingled magnetic recording (SMR).

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing, the write and read heads are employed for writing magnetic impressions to and reading magnetic signal fields from the rotating disk. The read and write heads are connected to processing circuitry that operates according to a computer program to implement the writing and reading functions.

As the areal storage density in HDDs increases, the demand for a larger magnetoresistive effect has led to extensive research efforts worldwide. In a conventional perpendicular magnetic recording (PMR) method where track widths have become narrower as a result of size reduction of recording heads, it is difficult to achieve both further size reduction for recording heads and improvement in the magnetic field strength generated. As a result, although various improvements have been made, it is generally considered that a recording density of about 1 Tbpsi (Tera bit per square inch) is a limit of areal storage density in the conventional PMR.

A recording system for achieving a recording density in excess of 1 Tbpsi is SMR. In SMR, a part of a track is recorded overlapped in the track width direction and the remaining portion is used as a data track. Because one side of the trace is written overlapped, it is possible to use recording heads with a wide magnetic pole. Therefore, the track pitch can be narrowed while maintaining a large magnetic field strength. The read head used in the SMR method may be the same as the read head used in the PMR method. For example, a read head using a spin valve device may be used. Hard disk type read heads with a hard magnetic body disposed in the track width direction of the spin valve and side shield type read heads generally attempt to reduce the spread in the read sensitivity distribution in the track width direction by using a soft magnetic body instead of a hard magnetic body. In general, these read heads are designed so that their read sensitivity distribution becomes symmetric in the off-track direction.

Signal distribution and noise distribution of data tracks recorded with the SMR method may not necessarily be symmetric left to right as a result of different ways used to form the edges at the two sides of the data track. For example, the edge of the data track on one side is formed by overwriting and the edge on the other side is formed by being overwritten. When a read head with left to right symmetry in the off-track direction is used, a high signal to noise ratio (SNR) cannot be obtained in the SMR method. Achieving a high SNR generally allows for higher areal density recording.

Therefore, there is a need in the art for a read head which is capable of obtaining a high SNR in the SMR method.

SUMMARY OF THE INVENTION

Embodiments described herein generally relate to a magnetic read head wherein read sensitivity distribution is made asymmetric in the off-track direction. The method of making the magnetic head is also disclosed. The read head may comprise a magneto-resistive effect element with an asymmetric structure around the element in the off-track direction and the read sensitivity profile in the off-track direction may also be asymmetric.

In one embodiment, a magnetic read head is provided. The magnetic read head may comprise a bottom shield layer, a magneto-resistive effect element formed on the bottom shield layer, and a top shield layer formed over the magneto-resistive effect element. One or more side shield layers may be disposed between the bottom shield layer and the top shield layer. An insulating layer may be disposed between the magneto-resistive effect element and the one or more side shield layers. The one or more side shield layers may be asymmetrically spaced from the magneto-resistive effect element in an off-track direction and may have an asymmetric read sensitivity profile in the off-track direction.

In another embodiment, a magnetic read head is provided. The magnetic read head may comprise a bottom shield layer, a magneto-resistive effect element formed on the bottom shield layer, and a top shield layer formed over the magneto-resistive effect element. A first side shield layer may be disposed between the bottom shield layer and the top shield layer and a second side shield layer may be disposed between the bottom shield layer and the top shield layer. A non-magnetic layer may be disposed between the first side shield layer and the top shield layer.

In yet another embodiment, a magnetic read head is provided. The magnetic read head may comprise a bottom shield layer, a magneto-resistive effect element formed on the bottom shield layer, and a top shield layer formed over the magneto-resistive effect element. A first side shield layer may be disposed between the bottom shield layer and the top shield layer and a second side shield layer may be disposed between the bottom shield layer and the top shield layer. A first non-magnetic layer may be disposed between the first side shield layer and the top shield layer and a second non-magnetic layer may be disposed between the second side shield layer and the top shield layer. The first non-magnetic layer and the second non-magnetic layer may have different thicknesses.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments described herein generally relate to a magnetic read head wherein read sensitivity distribution is made asymmetric in the off-track direction. The method of making the magnetic head is also disclosed. The read head may comprise a magneto-resistive effect element with an asymmetric structure around the element in the off-track direction and the read sensitivity profile in the off-track direction may also be asymmetric.

Figure 1:
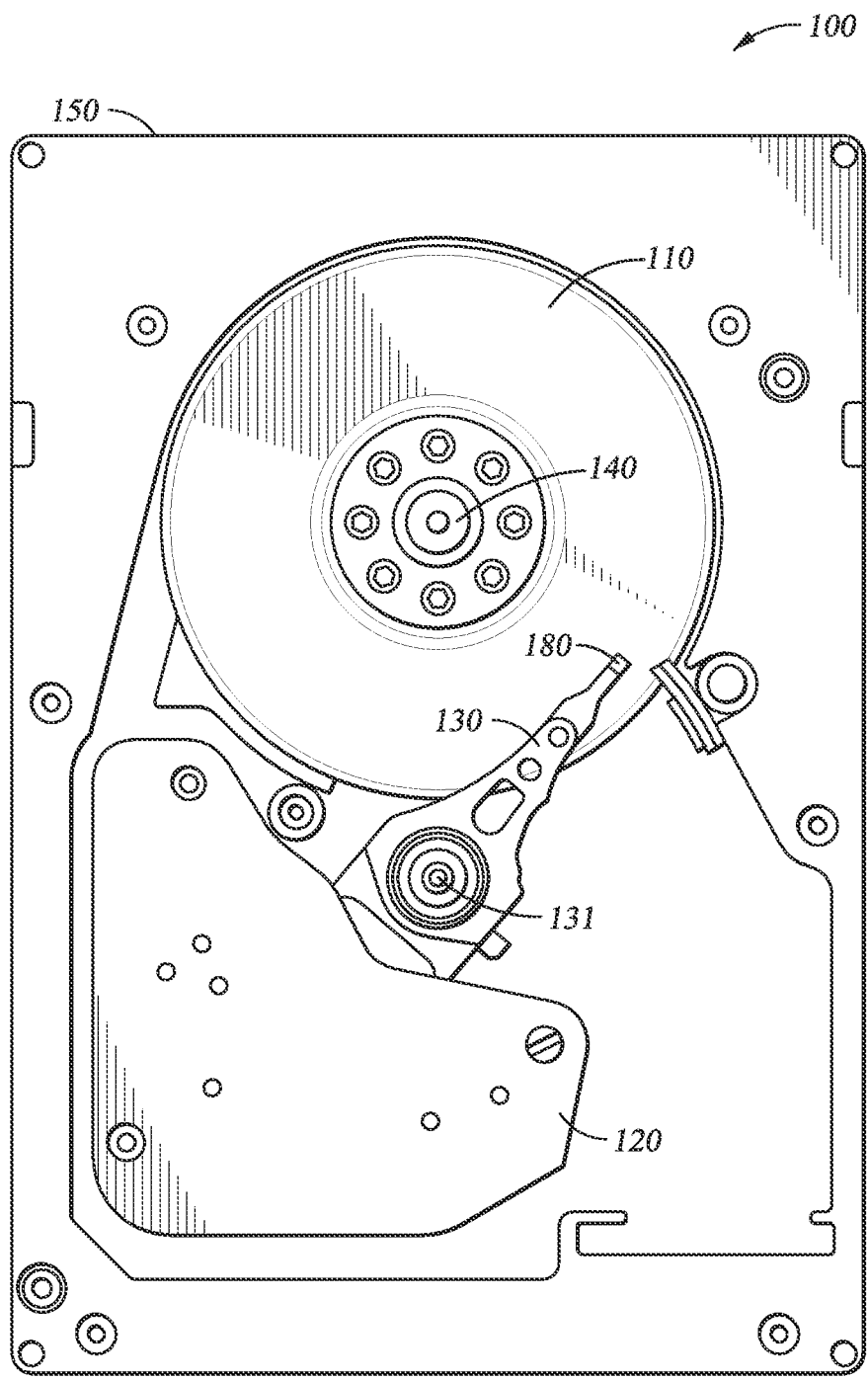
FIG. 1 illustrates an exemplary magnetic disk drive, according to certain embodiments.

FIG. 1 illustrates a top view of an exemplary HDD 100. The HDD 100 may include one or more magnetic disks 110, an actuator 120, actuator arms 130 associated with each of the magnetic disks 110, and a spindle motor 140 affixed in a chassis 150. The one or more magnetic disks 110 may be arranged vertically as illustrated in FIG. 1. Moreover, the one or more magnetic disks may be coupled with the spindle motor 140.

The magnetic disks 110 may include circular tracks of data on both the top and bottom surfaces of the disk. A magnetic head 180 mounted on a slider may be positioned adjacent a track. As each disk spins, data may be written on and/or read from the data track. The magnetic head 180 may be coupled to the actuator arm 130. The actuator arm 130 may be configured to swivel around an actuator axis 131 to place the magnetic head 180 adjacent a particular data track.

Figure 2:
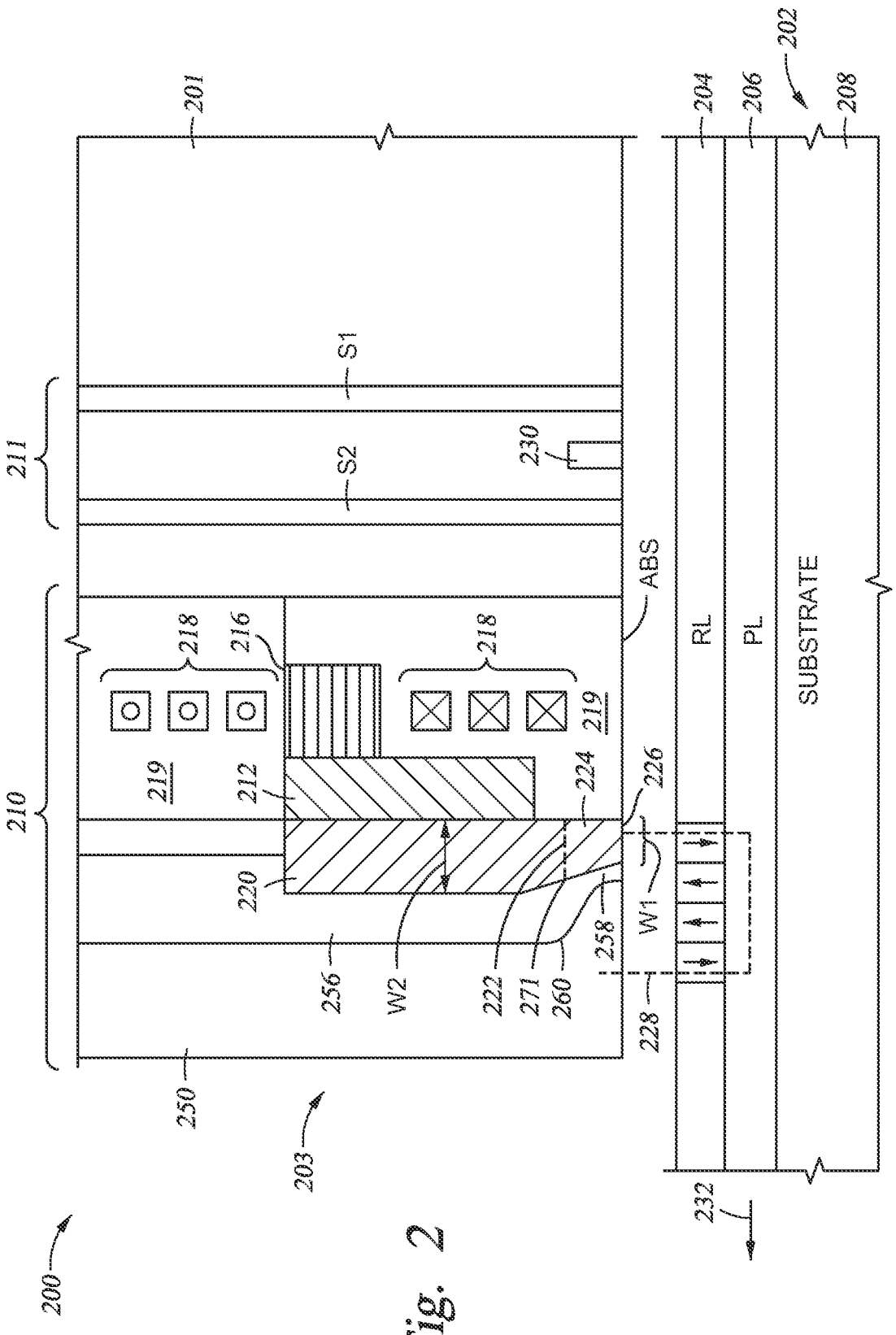
FIG. 2 is a cross-sectional side view of a read/write head and magnetic disk of the disk drive of FIG. 1, according to certain embodiments.

FIG. 2 is a fragmented, cross-sectional side view through the center of a read/write head 200 mounted on a slider 201 and facing a magnetic disk 202. The read/write head 200 and the magnetic disk 202 may correspond to the magnetic head 180 and magnetic disk 110, respectively, shown in FIG. 1. The magnetic disk 202 may be a "dual-layer" medium that includes a perpendicular magnetic data recording layer (RL) 204 on a "soft" or relatively low-coercivity magnetically permeable underlayer (PL) 206 formed on a disk substrate 208. The read/write head 200 includes an ABS, a magnetic write head 210 and a magnetic read head 211, and may be mounted such that the ABS is facing the magnetic disk 202. In FIG. 2, the disk 202 may move past the write head 210 in the direction indicated by the arrow 232. The portion of slider 201 that supports the read/write head 200 is often called the slider "trailing" end 203.

The magnetic read head 211 may be a MR read head that includes an MR sensing element 230 located between MR shields S1 and S2. In other embodiments, the magnetic read head 211 may be a MTJ read head that includes a MTJ sensing device 230 located between MR shields S1 and S2. The RL 204 is illustrated with perpendicularly recorded or magnetized regions, with adjacent regions having magnetization directions, as represented by the arrows located in the RL 204. The magnetic fields of the adjacent magnetized regions are detectable by the MR (or MTJ) sensing element 230 as the recorded bits.

The write head 210 may include a magnetic circuit made up of a main pole 212 and a yoke 216. The write head 210 may also include a thin film coil 218 shown in the section embedded in a non-magnetic material 219 and wrapped around the yoke 216. In an alternative embodiment, the yoke 216 may be omitted, and the coil 218 may wrap around the main pole 212. A write pole 220 may be magnetically connected to the main pole 212 and may have an end 226 that defines part of the ABS of the magnetic write head 210 facing the outer surface of disk 202.

The write pole 220 may be a flared write pole and may include a flare point 222 and a pole tip 224 that may include an end 226 that defines part of the ABS. The flare may extend the entire height of write pole 220 (i.e., from the end 226 of the write pole 220 to the top of the write pole 220), or may only extend from the flare point 222, as shown in FIG. 2A. In one embodiment, the distance between the flare point 222 and the ABS may be between about 30 nm and about 150 nm.

The write pole 220 may include a tapered surface 271 which increases a width of the write pole 220 from a first width W1 at the ABS to a second width W2 away from the ABS. In one embodiment, the width W1 may be between around 60 nm and 200 nm, and the width W2 may be between around 120 nm and 350 nm. While the tapered region 271 is shown with a single straight surface in FIG. 2, in alternative embodiment, the tapered region 271 may include a plurality of tapered surface with different taper angles with respect to the ABS.

The tapering may improve magnetic performance. For example, reducing the width W1 at the ABS may concentrate a magnetic field generated by the write pole 220 over desirable portions of the magnetic disk 202. In other words, reducing the width W1 of the write pole 220 at the ABS reduces the probability that tracks adjacent to a desirable track are erroneously altered during writing operations.

While a small width of the write pole 220 may be desired at the ABS, it may be desirable to have a greater width of the write pole 220 in areas away from the ABS. A larger width W2 of the write pole 220 away from the ABS may increase the magnetic flux to the write pole 220, by providing a greater thickness of the write pole 220 in a direction generally parallel to the ABS. In operation, write current passes through the coil 218 and induces a magnetic field (shown by dashed line 228) from the write pole 220 that passes through the RL 204 (to magnetize the region of the RL 204 beneath the write pole 220), through the flux return path provided by the PL 206, and back to an upper return pole 250. In one embodiment, the greater the magnetic flux of the write pole 220, the greater is the probability of accurately writing to desirable regions of the RL 204.

FIG. 2 further illustrates one embodiment of the upper return pole or magnetic shield 250 that may be separated from write pole 220 by a nonmagnetic gap layer 256. The magnetic shield 250 may be a trailing shield wherein substantially all of the shield material is on the trailing end 203. Alternatively, the magnetic shield 250 may be a wrap-around shield wherein the shield covers the trailing end 203 and also wraps around the sides of the write pole 220. As FIG. 2 is a cross section through the center of the read/write head 200, it represents both trailing and wrap-around embodiments.

Near the ABS, the nonmagnetic gap layer 256 may have a reduced thickness and form a shield gap throat 258. The throat gap width is generally defined as the distance between the write pole 220 and the magnetic shield 250 at the ABS. The shield 250 may be formed of magnetically permeable material (such as Ni, Co and Fe alloys) and the gap layer 256 may be formed of nonmagnetic material (such as Ta, TaO, Ru, Rh, NiCr, SiC or $Al_2O_3$). A taper 260 in the gap material provides a gradual transition from the throat gap width at the ABS to a maximum gap width above the taper 260. This gradual transition in width forms a tapered bump in the non-magnetic gap layer that allows for greater magnetic flux density from the write pole 220, while avoiding saturation of the shield 250.

It should be understood that the taper 260 may extend either more or less than is shown in FIG. 2. The taper may extend upwards to an end of shield 250 opposite the ABS (not shown), such that the maximum gap width is at the end of the shield opposite the ABS. The gap layer thickness increases from a first thickness (the throat gap width) at the ABS to greater thicknesses at a first distance from the ABS, to a greatest thickness at a second distance (greater than the first distance) from the ABS.

Figure 3:
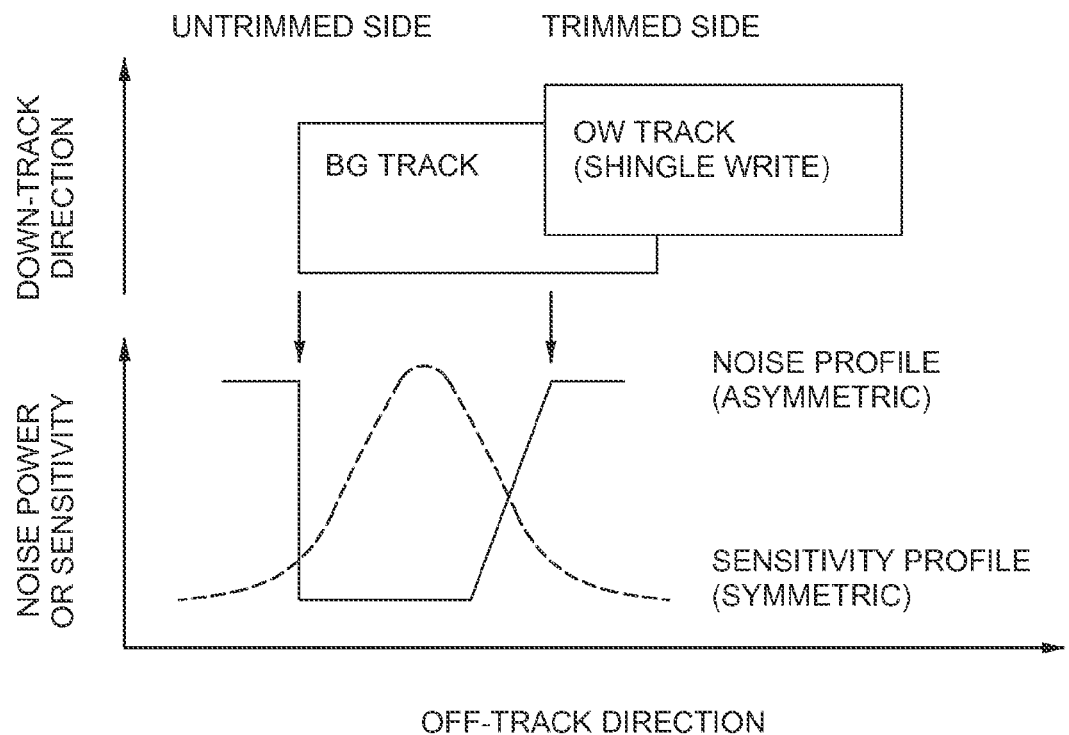
FIG. 3 schematically shows a noise distribution of a data track recorded with the SMR method and a symmetric read sensitivity distribution in the off-track direction.

FIG. 3 schematically shows the data track off-track noise distribution recorded in the SMR method. As previously mentioned, when a read head with left to right symmetry in the off-track direction is used, a high SNR cannot be obtained in the SMR method. The dotted line schematically shows the sensitivity distribution of modern reads heads. Although the sensitivity distribution is symmetric in the off-track direction, the noise distribution is asymmetric. The noise distribution is asymmetric in the SMR method because the methods of forming the edges of the two sides of the recorded data track are different. As depicted in FIG. 3, the noise on the edge of the data track on the side that is overwritten tends to be high.

Figure 4:
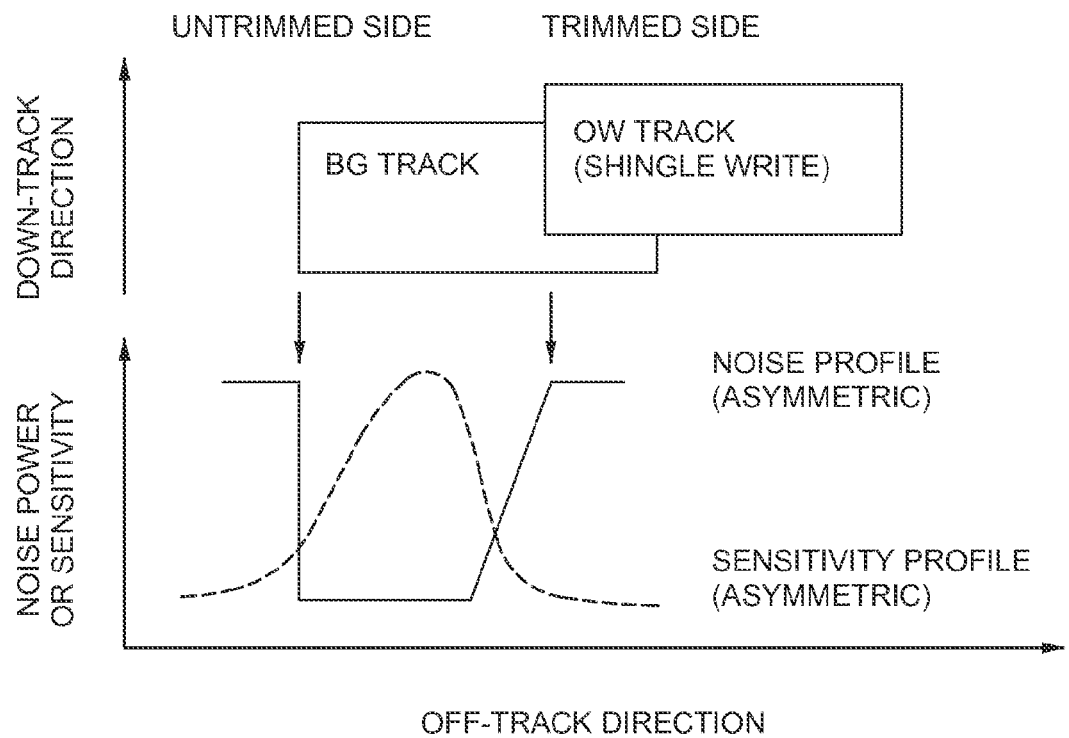
FIG. 4 schematically shows a noise distribution of a data track recorded with the SMR method and an asymmetric read sensitivity distribution in the off-track direction.

FIG. 4 schematically shows asymmetric read head read sensitivity distribution in the off-track direction. The read sensitivity may be reduced at the edge on the side where the noise is large. To achieve the asymmetric distribution, the read head may be configured such as described in greater detail below.

Figure 5:
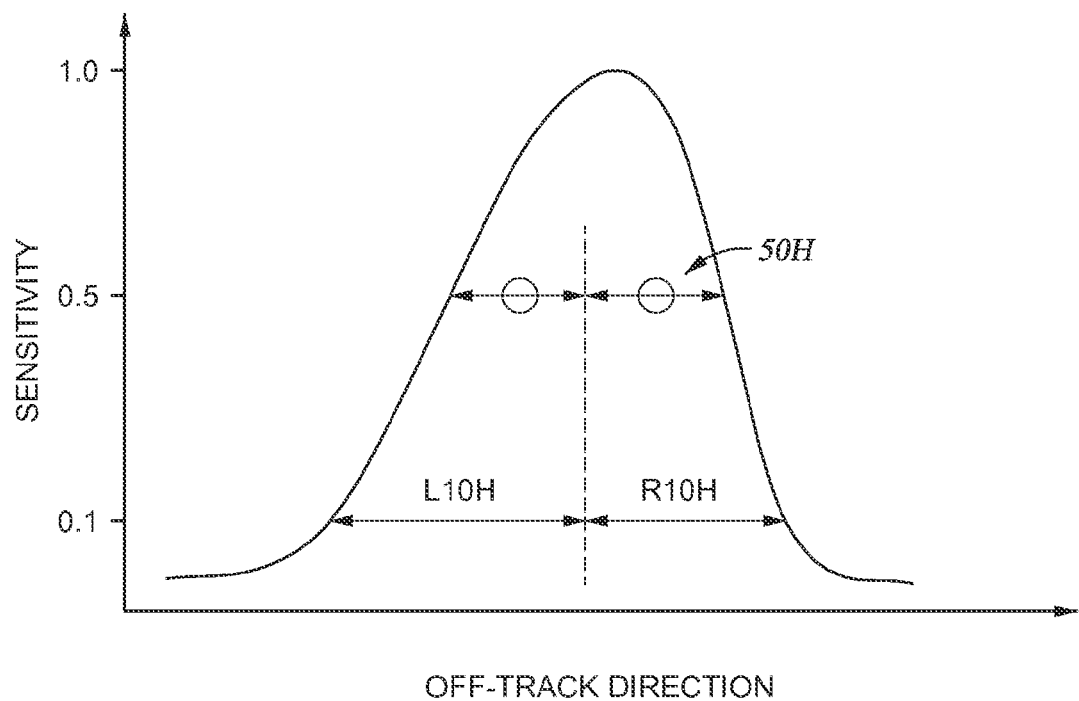
FIG. 5 schematically shows an asymmetric read sensitivity distribution in the off-track direction.

FIG. 5 schematically shows an asymmetric read sensitivity distribution. The half width at half maximum of the sensitivity distribution is defined as 50H. The left and right half widths at 10% sensitivity are defines as L10H and R10H, respectively. To obtain a high SNR by asymmetry of the read sensitivity distribution, an asymmetry of the read sensitivity distribution ((L10H−R10H)/50H) of 0.15 or higher may be used.

Figure 6:
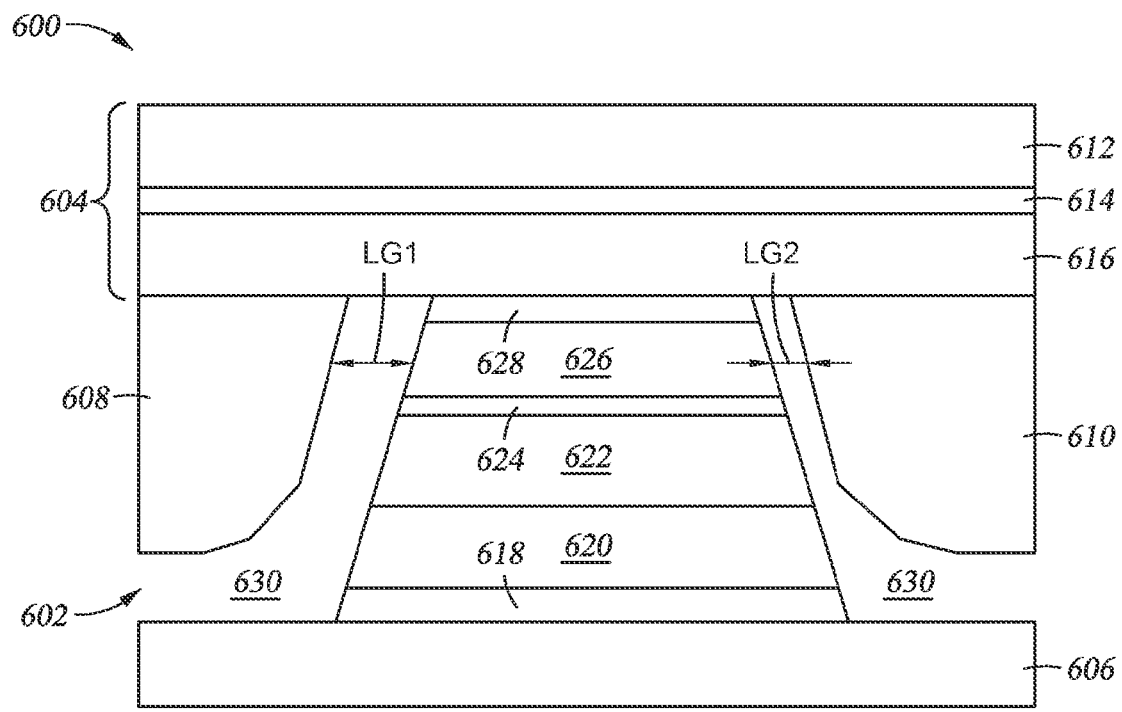
FIG. 6 is a schematic, cross-sectional view of a magnetic read head.

FIG. 6 is a schematic cross-sectional view of a magnetic head 600. The thickness of each layer and the width of each layer, are for example only, and each layer may be thicker/thinner and/or wider/narrower. The magnetic head 600, which may be a read head, may include a top shield layer 604, a bottom shield layer 606, a left side shield layer 608, and a right side shield layer 610. The bottom shield layer 606 may comprise a ferromagnetic material, or "soft" magnetic material. Suitable ferromagnetic materials that may be utilized include Ni, Fe, Co, NiFe, NiCoFe, NiCo, CoFe and combinations thereof.

The magnetic head 600 may also include a spin valve device, for example, a TMR element 602. The TMR element 602 (magneto-resistive effect element) may comprise the bottom shield layer 606, a substrate layer 618, an antiferromagnetic layer 620, a pinned magnetic layer 622, a barrier layer 624, a free magnetization layer 626, a capping layer 628, and the top shield layer 604 laminated in the aforementioned order. The substrate layer 618 may be formed on the bottom shield layer 606 by various deposition processes, such as physical vapor deposition (PVD), atomic layer deposition (ALD), chemical vapor deposition (CVD), or the like. The substrate layer 618 may comprise Ta, Ru, and combinations thereof and may have a thickness of between about 1 nm and about 5 nm, such as about 3 nm.

The antiferromagnetic layer 620 may be formed on the substrate layer 618 and may include materials such as PtMn, IrMn, iridium, or rhodium. The thickness of the antiferromagnetic layer 620 may be between about 2 nm and about 6 nm, such as about 4 nm. The pinned magnetic layer 622 may be formed over the antiferromagnetic layer 620 and may be one of several types of pinned layers, such as a simple pinned, antiparallel pinned, self pinned or antiferromagnetic pinned sensor. For purposes of simplicity, the sensor will be described herein as an antiparallel pinned, antiferromagnetic pinned sensor having a first antiparallel layer, a second antiparallel layer, and a non-magnetic, antiferromagnetic coupling layer, such as Ru sandwiched therebetween. The first and second antiparallel layers can be constructed of several magnetic materials such as, for example NiFe or CoFe, and have magnetic moments that are pinned by exchange coupling of the first antiparallel layer with a layer of antiferromagnetic material. A thickness of the pinned magnetic layer 622 may be between about 1 nm and about 3 nm, such as about 2 nm.

The barrier layer 624 may be formed over the pinned magnetic layer 622, may comprise an insulating material such as MgO or $AlO_x$ (i.e., alumina), and may have a thickness of about 1 nm. The free magnetization layer 626 may be formed over the barrier layer 624, may comprise ferromagnetic material such as Co, CoFe, CoFeB, CoFeNiB, NiFe or combinations thereof, and may have a thickness of between about 2 nm and about 10 nm, such as about 6 nm. The capping layer 628 may be formed over the free magnetization layer 626, may comprise a material to protect the TMR element 602 from damage, such as Ru or Ta, and may have a thickness of between about 2 nm and about 6 nm, such as about 4 nm. Although depicted in FIG. 6, the capping layer 628 may not be necessary in certain embodiments.

Following the formation of the TMR element 602, an insulating layer 630 may be deposited on the bottom shield layer 606 as well as the sidewalls of the TMR element 602. The insulating layer 630 may comprise an insulating material such as aluminum oxide. The insulating layer 630 may be deposited by well known deposition methods such as ALD, CVD, sputtering, etc. After the insulating layer 630 has been deposited, the left shield layer 608 and the right shield layer 610 may be formed on the left and right sides, respectively, of the TMR element 602. However, the insulating layer 630 may be disposed between the side shield layers 608, 610 and the TMR element 602. The side shield layers 608, 610 may comprise materials such as Ni, Fe, NiFe, CoFe, NiCoFe, and combinations thereof. The side shield layers 608, 610 may comprise different material. For example, the left side shield layer 608 may comprise Ni and the right side shield layer 610 may comprise CoFe. Additionally, the side shield layers 608, 610 may be ferromagnetically coupled to the top shield layer 604. Thus, the side shield layer 608, 610 may be in contact with the top shield layer 604.

The top shield layer 604 may comprise one or more layers. For example, the top shield layer 604 may comprise a first layer 616 which may be (as previously described) ferromagnetically coupled to the side shield layers 608, 610, a second layer 612, and a third layer 614 which may be disposed between the first layer 616 and the second layer 612. The first layer 616 and second layer 612 may be formed from a first material, such as NiFe, and the third layer 614 may be formed from a second material, which is different from the first material, such as Ru.

The side shield layers 608, 610 may be spaced from the TMR element 602 by various lengths. The lengths, known as gaps, may be occupied by the insulating material 630. The first gap length Lg1 between the left shield layer 608 and the free magnetization layer 626 and a second gap length Lg2 between the right shield layer 610 and the free magnetization layer 626 may be within a range defined by the equation (Lg1−Lg2)>1.0 nm (Equation 1). The first gap length Lg1 and second gap length Lg2 may each be between about 1.0 nm and about 10 nm to have an appropriate read utilization and domain controllability.

Figure 7:
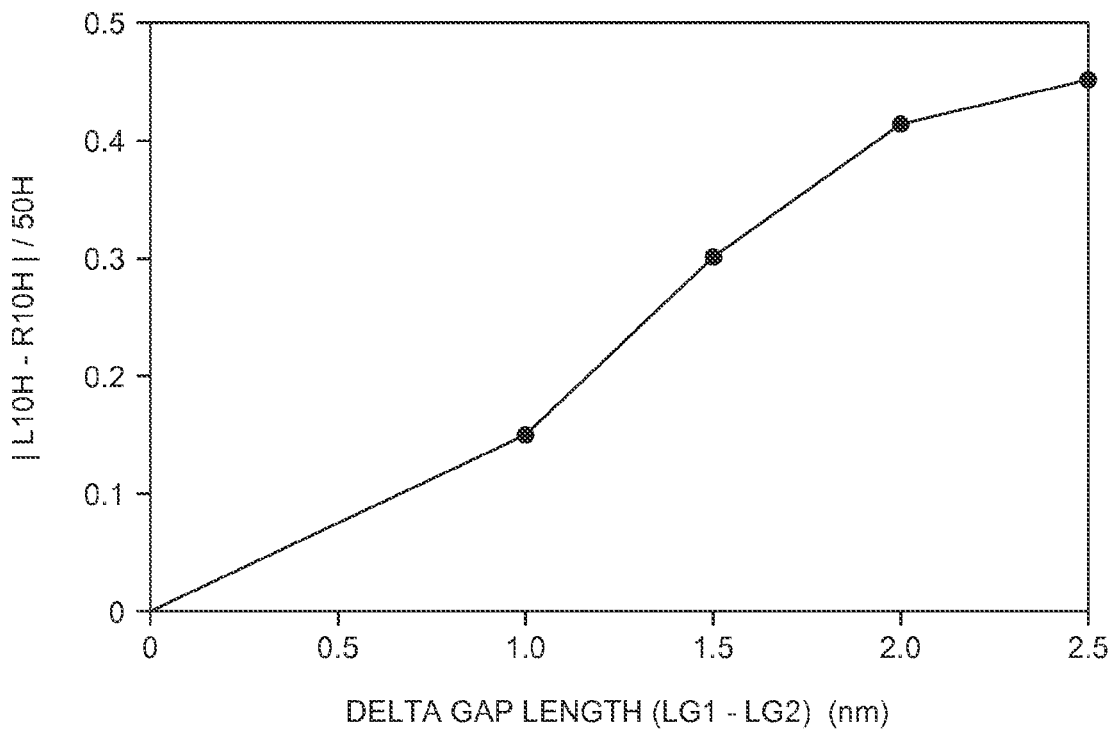
FIG. 7 is a graph depicting the relationship between gap length and the degree of asymmetry of the read sensitivity distribution.

FIG. 7 represents the relationship between the difference in gap length and the degree of asymmetry of the read sensitivity distribution. In the graph, Lg2 is 2.0 nm and Lg1 is increased. It can be seen that the degree of asymmetry increases as the difference in gap length increases. This result may be obtained because it is believed that the magnitude of the shield effect depends on the gap length.

Figure 8:
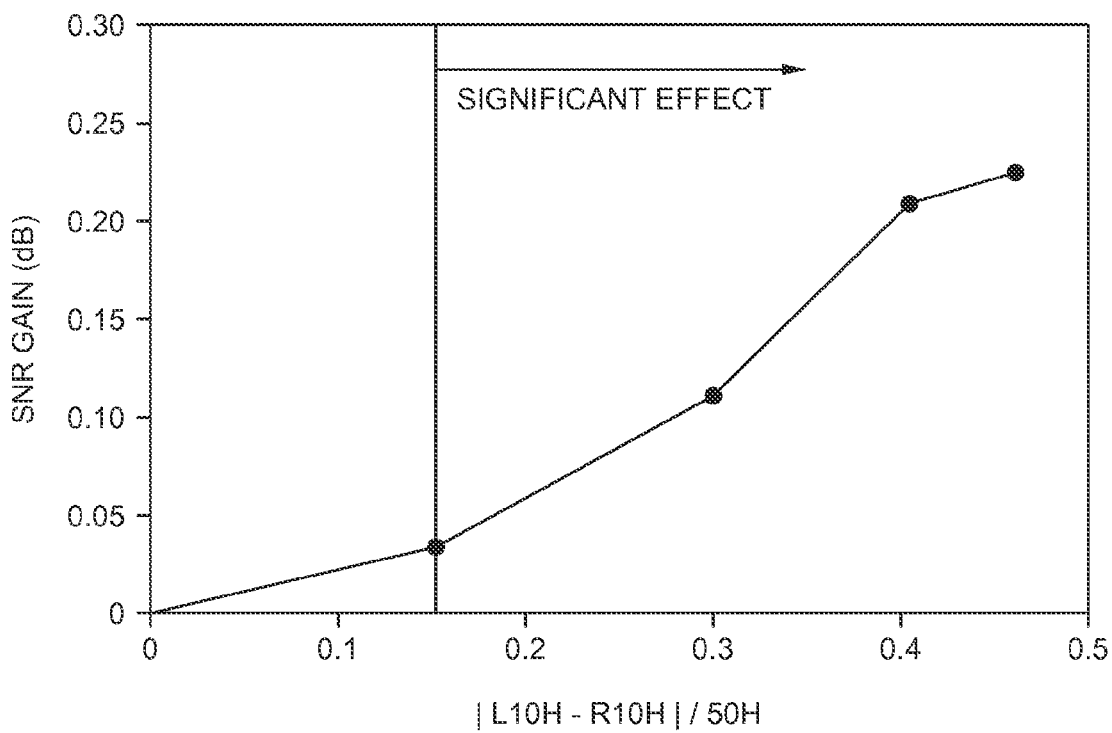
FIG. 8 is a graph depicting the relationship between the degree of asymmetry of the read sensitivity distribution and SNR gain.

FIG. 8 graphically depicts the relationship between the degree of asymmetry and the SNR gain. The SNR gain may be defined as the amount of increase compared with the SNR obtained using symmetric sensitivity distribution. The SNR was calculated using the actual measured signal distribution, noise distribution, and sensitivity distributions with various degrees of asymmetry. The track pitch of the data tracks recorded using the SMR method was 52 nm and the read sensitivity width of all the sensitivity distributions was 28.5 nm. It can be seen that when the degree of asymmetry is greater than 0.15, a significant improvement in the SNR may be obtained. Therefore, from the relationship between the difference in gap length and the degree of asymmetry of the read sensitivity distribution of FIG. 7, it can be seen that when (Lg1−Lg2)>1.0 nm in the read head, an improved SNR may be obtained.

Figure 9:
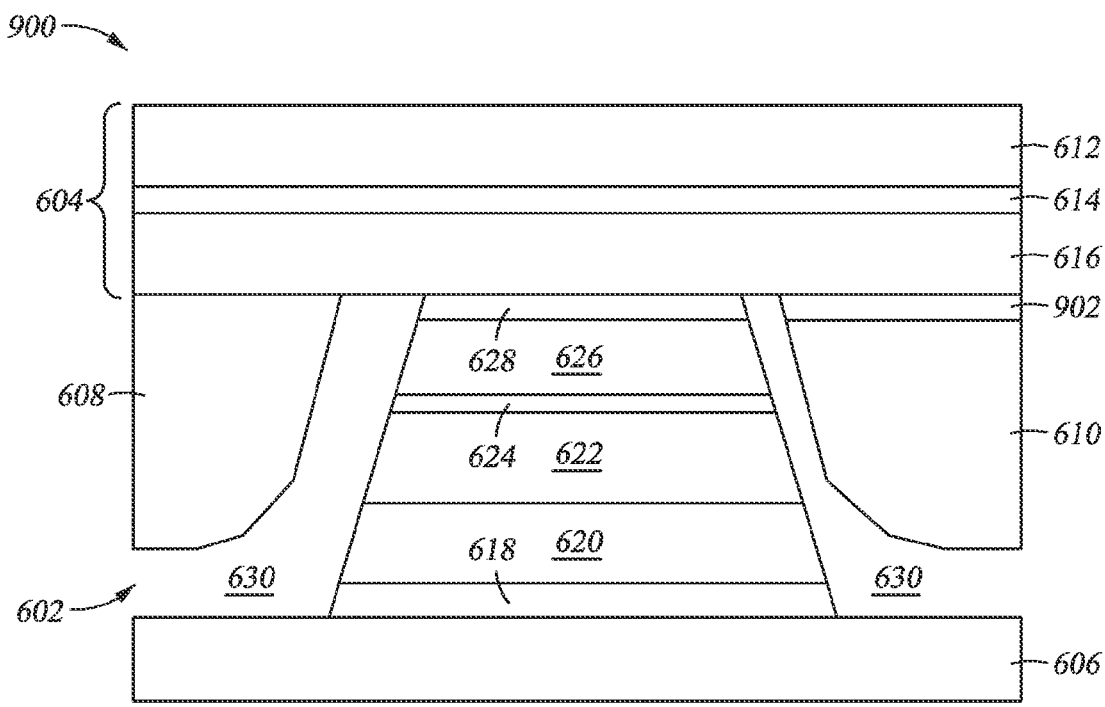
FIG. 9 is a schematic, cross-sectional view of a magnetic read head.

FIG. 9 is a schematic cross-sectional view of a magnetic head 900. The magnetic head 900 may be substantially similar to the magnetic head 600 shown in FIG. 6 except that a non-magnetic layer 902 may be disposed between the right shield layer 610 and the top shield layer 604. The non-magnetic layer 902 may be formed from a material, such as Ru, Rh, Cr, Cu, Ag, combinations thereof, and the like. A thickness of the non-magnetic layer 902 may be between about 1 nm and about 5 nm. A soft bias magnetic field may be formed such that the magnetic field is applied parallel to the free magnetization layer 626.

Figure 10:
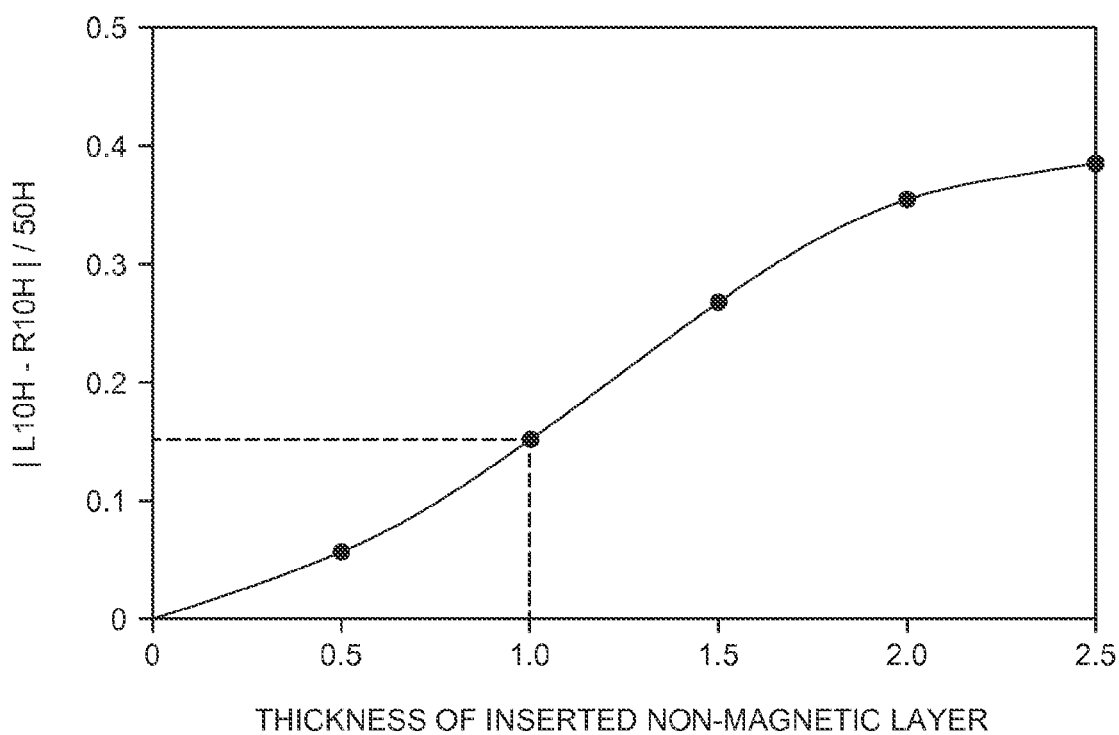
FIG. 10 is a graph depicting the relationship between the non-magnetic layer thickness and the degree of asymmetry of the read sensitivity distribution.

FIG. 10 graphically represents the relationship between the non-magnetic layer 902 thickness and the degree of asymmetry of the read sensitivity distribution. It can be seen that as the thickness of the non-magnetic layer 902 increases, the degree of asymmetry also increases. This result is obtained because as the magnetic coupling between the right shield layer 610 and the top shield layer 604 weakens, the effective magnetic permeability of the right shield layer 610 increases and the magnitude of the shield effect changes. From the relationship between the degree of asymmetry of the read sensitivity distribution and the SNR gain of FIG. 8, it can be seen that when the thickness of the non-magnetic layer 902 is about 1.0 nm or greater in the read head, an improved SNR may be obtained.

Figure 11:
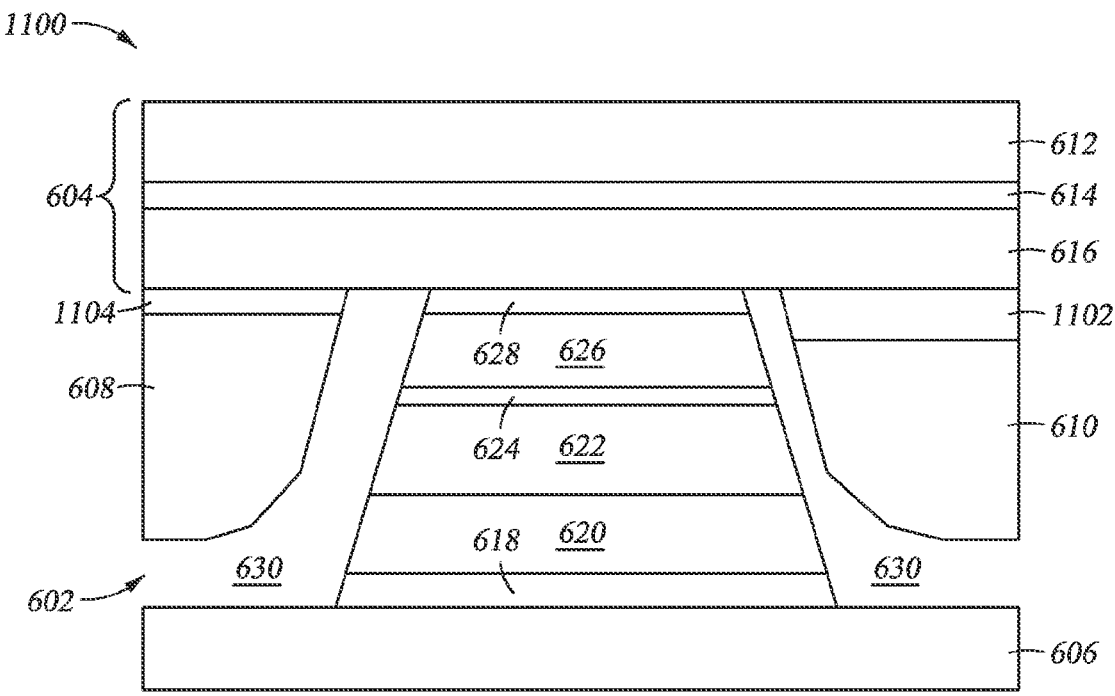
FIG. 11 is a schematic, cross-sectional view of a magnetic read head.

FIG. 11 is a schematic cross-sectional view of a magnetic head 1100. The magnetic head 1100 may be substantially similar to the magnetic head 900 shown in FIG. 9 except that a first non-magnetic layer 1102 may be disposed between the right shield layer 610 and the top shield layer 604 and a second non-magnetic layer 1104 may be disposed between the left shield layer 608 and the top shield layer 604. The first non-magnetic layer 1102 may have a thickness greater than a thickness of the second non-magnetic layer 1104. The relationship between the thicknesses and the degree of asymmetry of the read sensitivity distribution is discussed below with reference to FIG. 12.

Figure 12:
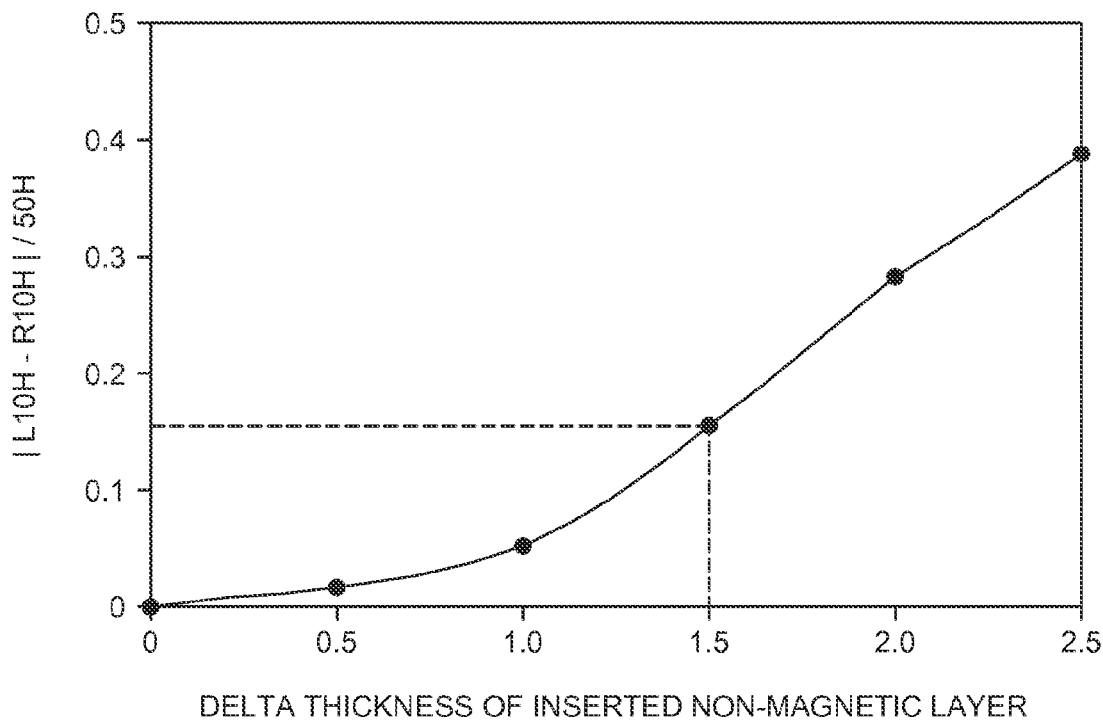
FIG. 12 is a graph depicting the relationship between the difference in thickness of non-magnetic layers and the degree of asymmetry of the read sensitivity distribution.

FIG. 12 graphically depicts the relationship between the difference in thickness of the non-magnetic layers 1102, 1104 and the degree of asymmetry of the read sensitivity distribution. A significant improvement of the SNR may be obtained when the difference in thickness of the second non-magnetic layer 1104 and the first non-magnetic layer 1102 (left to right) is about 1.5 nm or greater. As compared with the magnetic head 900 of FIG. 9, in which a single side is ferromagnetically coupled, it may be difficult to achieve a left to right difference in asymmetry of the read sensitivity distribution when both sides are not ferromagnetically coupled. Thus, as previously described, a thickness of about 1.5 nm or greater between the first non-magnetic layer 1102 and the second non-magnetic layer 1104 may be provided to achieve a desired asymmetry.

In sum, to achieve an asymmetric read sensitivity distribution, the magnetic head may be configured in several manners. In one embodiment, the magnetic head may be configured with asymmetric gaps between the free magnetization layer and the side shield layer formed on both sides of the TMR element in the off track direction. The gaps may each bet between about 1.0 nm and about 10 nm and may differ by 1.0 nm or more left to right. In another embodiment, a non-magnetic layer, having thickness of between about 1.0 nm and about 5 nm, may be formed on one side only between the side shield layer formed on both sides of the TMR element and top shield layer. Alternatively, the non-magnetic layer may be disposed on both sides between the side shield layer and the top shield layer and may be between about 1.0 nm and about 5 nm. The thickness of the non-magnetic layer in this embodiment may differ from left to right by about 1.5 nm or more.

While the foregoing is directed to embodiments of the present invention, other and further embodiments of the invention may be devised without departing from the basic scope thereof, and the scope thereof is determined by the claims that follow.

What is claimed is:

1. A magnetic read head, comprising:
a bottom shield layer;
a magneto-resistive effect element formed on the bottom shield layer;
a top shield layer formed over the magneto-resistive effect element;
one or more side shield layers disposed between the bottom shield layer and the top shield layer; and
an insulating layer disposed between the magneto-resistive effect element and the one or more side shield layers, wherein the one or more side shield layers are asymmetrically spaced from the magneto-resistive effect element in an off-track direction and have an asymmetric read sensitivity profile in the off-track direction.

2. The magnetic read head of claim 1, wherein the asymmetry of a sensitivity distribution is defined by ((L10H−R10H))/50H is 0.15 or greater, wherein 50H is a half width at half maximum of the sensitivity distribution and L10H and R10H are left and right half widths at 10% sensitivity, respectively.

3. The magnetic read head of claim 1, wherein a first gap length and a second gap length between the magneto-resistive effect element and the one or more side shield layers are between about 1 nm and about 10 nm.

4. The magnetic read head of claim 3, wherein the first gap length and the second gap length differ by about 1.5 nm or greater from left to right.

5. The magnetic read head of claim 1, wherein a first side shield layer and a second side shield layer comprise different metal materials.

6. The magnetic read head of claim 5, wherein the first side shield layer is a left side shield comprising a Ni material.

7. The magnetic read head of claim 6, wherein the second side shield layer is a right side shield comprising a CoFe material.

8. A magnetic read head, comprising:
a bottom shield layer;
a magneto-resistive effect element formed on the bottom shield layer;
a top shield layer formed over the magneto-resistive effect element;
a first side shield layer disposed between the bottom shield layer and the top shield layer;
a second side shield layer disposed between the bottom shield layer and the top shield layer; and
a non-magnetic layer disposed between the first side shield layer and the top shield layer.

9. The magnetic read head of claim 8, wherein the magneto-resistive effect element has an asymmetry of a sensitivity distribution defined by ((L10H−R10H))/50H is 0.15 or greater, wherein 50H is a half width at half maximum of the sensitivity distribution and L10H and R10H are left and right half widths at 10% sensitivity, respectively.

10. The magnetic read head of claim 8, further comprising an insulating material disposed between the magneto-resistive effect element and both the first side shield layer and the second side shield layer.

11. The magnetic read head of claim 10, wherein the first side shield layer and the second side shield layer are asymmetrically spaced from the magneto-resistive effect element.

12. The magnetic read head of claim 8, wherein the first side shield layer and the second side shield layer comprise different metal materials.

13. The magnetic read head of claim 8, wherein the non-magnetic layer has a thickness of between about 1 nm and about 5 nm.

14. A magnetic read head, comprising:
a bottom shield layer;
a magneto-resistive effect element formed on the bottom shield layer;
a top shield layer formed over the magneto-resistive effect element;
a first side shield layer disposed between the bottom shield layer and the top shield layer;
a second side shield layer disposed between the bottom shield layer and the top shield layer;
a first non-magnetic layer is disposed between the first side shield layer and the top shield layer; and
a second non-magnetic layer is disposed between the second side shield layer and the top shield layer, wherein the first non-magnetic layer and the second non-magnetic layer have different thicknesses.

15. The magnetic read head of claim 14, wherein the magneto-resistive effect element has an asymmetry of a sensitivity distribution is defined by ((L10N−R10H))/50H is 0.15 or greater, wherein 50H is a half width at half maximum of the sensitivity distribution and L10H and R10H are left and right half widths at 10% sensitivity, respectively.

16. The magnetic read head of claim 14, further comprising an insulating material disposed between the magneto-resistive effect element and both the first side shield layer and the second side shield layer.

17. The magnetic read head of claim 14, wherein the first side shield layer and the second side shield layer comprise different metal materials.

18. The magnetic read head of claim 14, wherein a thickness of the first and second non-magnetic layers is between about 1 nm and about 5 nm.

19. The magnetic read head of claim 18, wherein the thickness of the first non-magnetic layer differs from the thickness of the second non-magnetic layer from left to right by about 1.5 nm or greater.

20. The magnetic read head of claim 18, wherein the non-magnetic layers are formed from a material selected from the group consisting of Ru, Rh, Cr, Cu, and Ag.

* * * * *

UNITED STATES PATENT AND TRADEMARK OFFICE
CERTIFICATE OF CORRECTION

| | |
|---|---|
| PATENT NO. | : 9,082,434 B2 |
| APPLICATION NO. | : 14/067483 |
| DATED | : July 14, 2015 |
| INVENTOR(S) | : Aoyama et al. |

It is certified that error appears in the above-identified patent and that said Letters Patent is hereby corrected as shown below:

In the Claims:

Column 10, Claim 15, Line 34, delete "((L10N-R10H))/50H" and insert --((L10H-R10H))/50H-- therefor.

Signed and Sealed this
Twenty-second Day of December, 2015

Michelle K. Lee
*Director of the United States Patent and Trademark Office*